US008306299B2

(12) United States Patent
Samsonov et al.

(10) Patent No.: US 8,306,299 B2
(45) Date of Patent: Nov. 6, 2012

(54) METHOD FOR RECONSTRUCTING MOTION-COMPENSATED MAGNETIC RESONANCE IMAGES FROM NON-CARTESIAN K-SPACE DATA

(75) Inventors: Alexey A Samsonov, Madison, WI (US); Ashley G Anderson, III, Madison, WI (US); Julia Velikina, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 108 days.

(21) Appl. No.: 13/072,353

(22) Filed: Mar. 25, 2011

(65) Prior Publication Data

US 2012/0243756 A1    Sep. 27, 2012

(51) Int. Cl.
*G06K 9/00* (2006.01)
*A61B 5/05* (2006.01)
(52) U.S. Cl. ........................................ 382/128; 600/410
(58) Field of Classification Search ........................ None
See application file for complete search history.

(56) References Cited

U.S. PATENT DOCUMENTS

| | | | | | |
|---|---|---|---|---|---|
| 5,531,520 | A | * | 7/1996 | Grimson et al. | 382/131 |
| 5,850,486 | A | * | 12/1998 | Maas et al. | 382/294 |
| 6,178,271 | B1 | * | 1/2001 | Maas, III | 382/294 |
| 6,329,819 | B1 | * | 12/2001 | Manduca et al. | 324/309 |
| 6,647,134 | B1 | * | 11/2003 | McGee et al. | 382/128 |
| 6,771,998 | B2 | * | 8/2004 | Kirsch | 600/410 |
| 6,996,261 | B2 | * | 2/2006 | deCharms | 382/131 |
| 7,127,092 | B2 | * | 10/2006 | Jack et al. | 382/128 |
| 7,176,684 | B2 | | 2/2007 | Patch et al. | |
| 7,184,814 | B2 | * | 2/2007 | Lang et al. | 600/416 |
| 7,239,908 | B1 | * | 7/2007 | Alexander et al. | 600/427 |
| 7,245,752 | B2 | * | 7/2007 | Oesingmann | 382/128 |
| 7,245,786 | B2 | * | 7/2007 | Mitchell et al. | 382/280 |
| 7,254,437 | B2 | * | 8/2007 | Miyazaki | 600/410 |
| 7,308,125 | B2 | * | 12/2007 | Atkinson | 382/131 |
| 7,336,073 | B2 | | 2/2008 | Patch et al. | |
| 7,463,919 | B2 | * | 12/2008 | Hamilton et al. | 600/410 |
| 7,756,566 | B2 | * | 7/2010 | Machida | 600/415 |
| 7,860,291 | B2 | * | 12/2010 | Hwang | 382/131 |
| 7,881,511 | B2 | * | 2/2011 | Ye et al. | 382/128 |
| 7,945,079 | B2 | * | 5/2011 | Rosen | 382/128 |
| 8,086,003 | B2 | * | 12/2011 | Pfeuffer | 382/128 |

OTHER PUBLICATIONS

Bammer et al., Augmented Generalized SENSE Reconstruction to Correct for Rigid Body Motion, Magnetic Resonance in Medicine, 2007, 57(1):90-102.
Pipe, Motion Correction with Propeller MRI: Application to Head Motion and Free-Breathing Cardiac Imaging, Magnetic Resonance in Medicine, 1999, 42:963-969.
Welch et al., Self-Navigated Motion Correction Using Moments of Spatial Projections in Radial MRI, Magnetic Resonance in Medicine, 2004, 52:337-345.

* cited by examiner

*Primary Examiner* — Manav Seth
(74) *Attorney, Agent, or Firm* — Quarles & Brady, LLP

(57) ABSTRACT

A method for reconstructing a motion-compensated image depicting a subject with a magnetic resonance imaging (MRI) system is provided. An MRI system is used to acquire a time series of k-space data from the subject by sampling k-space along non-Cartesian trajectories, such as radial, spiral, or other trajectories at a plurality of time frames. Those time frames at which motion occurred are identified and this information used to segment the time series into a plurality of k-space data subsets. For example, the k-space data subsets contain k-space data acquired at temporally adjacent time frames that occur between those identified time frames at which motion occurred. Motion correction parameters are determined from the k-space data subsets. Using the determined motion correction parameters, the k-space data subsets are corrected for motion. The corrected data subsets are combined to form a corrected k-space data set, from which a motion-compensated image is reconstructed.

20 Claims, 4 Drawing Sheets

METHOD FOR RECONSTRUCTING MOTION-COMPENSATED MAGNETIC RESONANCE IMAGES FROM NON-CARTESIAN K-SPACE DATA

STATEMENT REGARDING FEDERALLY SPONSORED RESEARCH

This invention was made with government support under NS065034 awarded by the National Institutes of Health. The government has certain rights in the invention.

BACKGROUND OF THE INVENTION

The field of the invention is systems and method for magnetic resonance imaging ("MRI"). More particularly, the invention relates to methods for producing motion-compensated MR images.

Magnetic resonance imaging ("MRI") is highly sensitive to patient motion. Depending on the k-space acquisition trajectory, motion can cause blurring, ghosting, or other artifacts that reduce image quality and diagnostic value of the images, thereby reducing the diagnostic information available to the clinician or requiring repeated scans. Most physiological motion artifacts can be suppressed by proper gating techniques; however, bulk motion remains a clinical problem, particularly in three-dimensional imaging where the prolonged acquisition time increases the likelihood of the occurrence of motion artifacts. Especially challenging subject groups include pediatric, uncooperative, and impaired patients.

Gross body motion such as muscle twitching, adjusting for comfort, or restlessness often occurs in a discontinuous manner with longer, interleaved periods in which no motion occurs. Many successful retrospective motion correction techniques rely on this assumption and compare low resolution images that function as navigators acquired during the motion-free segments for successive motion correction. PROPELLER is one such approach, and has achieved widespread use in clinical applications, particularly in cranial imaging. In a PROPELLER scan, two-dimensional Cartesian k-space data are acquired in successively rotated strips of parallel lines called "blades," with the assumption that motion occurs in-plane only and that no motion occurs during the acquisition of a blade. Motion parameters for translational and rotational in-plane motion are then determined by comparing low-resolution information from individual blades. Wider blades allow for more sensitive corrections; however, increasing the number of echoes per blade also increases the probability of in-blade motion and, for some pulse sequences, is limited by the available echo-train length. For the same reasons, straightforward extensions of PROPELLER to three dimensions by acquiring three-dimensional bricks instead of blades may have limited performance.

Despite reduction in imaging times through improved hardware and rapid acquisition schemes, motion artifacts can compromise image quality in MRI. This is especially true for three-dimensional imaging, where scan durations are prolonged and the assumptions of most state-of-the-art two-dimensional rigid body motion compensation techniques break down.

It would therefore be desirable to provide a method for producing motion-compensated images, especially in three dimensions, without the need for additional navigator data or external motion estimation schemes.

SUMMARY OF THE INVENTION

The present invention overcomes the aforementioned drawbacks by providing a method for reconstructing a motion-compensated image depicting a subject with a magnetic resonance imaging ("MRI") system that does not require any additional navigators or external motion estimation schemes is provided.

It is an aspect of the invention to provide a method for motion-compensated image reconstruction in which an MRI system is used to acquire a time series of k-space data from the subject by sampling k-space along non-Cartesian trajectories, such as radial, spiral, or other trajectories at a plurality of time frames. Those time frames at which motion occurred are identified and this information used to segment the time series of k-space data into a plurality of k-space data subsets. For example, the k-space data subsets contain k-space data acquired at temporally adjacent time frames that occur between the identified time frames at which motion occurred. Motion correction parameters, such as translational and rotation motion correction parameters, are determined from the k-space data subsets. Using the determined motion correction parameters, the k-space data subsets are corrected for motion. The corrected data subsets are combined to form a corrected k-space data set, from which a motion-compensated image is reconstructed.

It is another aspect of the invention to provide a method for reconstructing a motion-compensated image depicting a subject with an MRI system, in which the MRI system is used to acquire a time series of k-space data from the subject by sampling k-space along non-Cartesian trajectories, such as radial, spiral, or other trajectories at a plurality of time frames. The acquired time series of k-space data is segmented to produce a plurality of k-space data subsets using a preselected segmentation scheme, in which each k-space data subset contains k-space data acquired in temporally adjacent time frames. For example, the time series of k-space data may be segmented into interleaved k-space data subsets. Motion correction parameters are determined from the k-space data subsets and these motion correction parameters are used to correct the k-space data subsets. The corrected k-space data subsets are then combined to form a corrected k-space data set, from which images of the subject are reconstructed.

The foregoing and other aspects and advantages of the invention will appear from the following description. In the description, reference is made to the accompanying drawings, which form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION OF THE INVENTION

Figure 1:
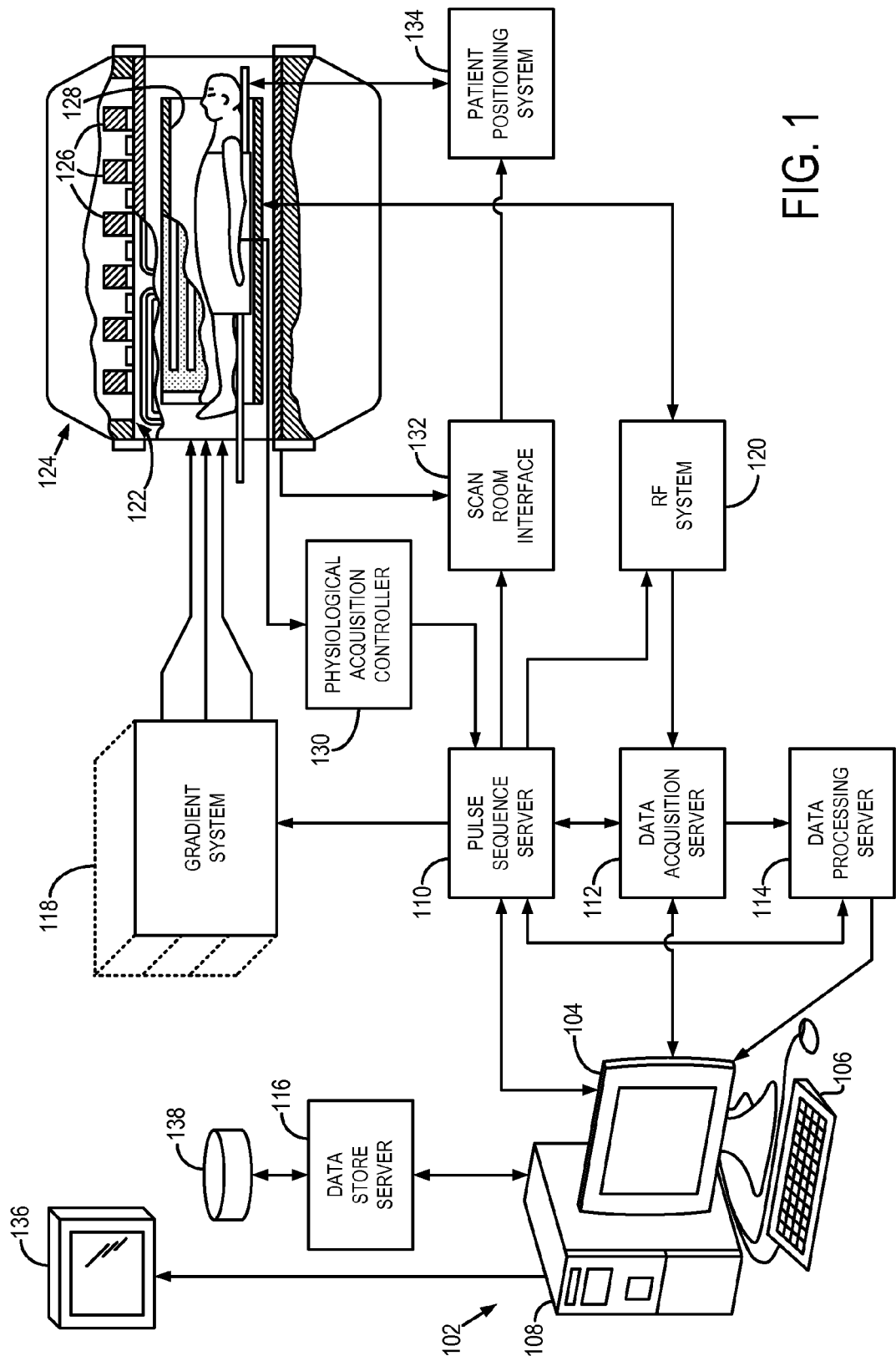
FIG. 1 is a block diagram of an exemplary magnetic resonance imaging ("MRI") system.

Referring particularly now to FIG. 1, an exemplary magnetic resonance imaging ("MRI") system 100 is illustrated. The MRI system 100 includes a workstation 102 having a display 104 and a keyboard 106. The workstation 102 includes a processor 108, such as a commercially available programmable machine running a commercially available operating system. The workstation 102 provides the operator interface that enables scan prescriptions to be entered into the MRI system 100. The workstation 102 is coupled to four servers: a pulse sequence server 110; a data acquisition server 112; a data processing server 114, and a data store server 116. The workstation 102 and each server 110, 112, 114 and 116 are connected to communicate with each other.

The pulse sequence server 110 functions in response to instructions downloaded from the workstation 102 to operate a gradient system 118 and a radiofrequency ("RF") system 120. Gradient waveforms necessary to perform the prescribed scan are produced and applied to the gradient system 118, which excites gradient coils in an assembly 122 to produce the magnetic field gradients $G_x$, $G_y$, and $G_z$ used for position encoding MR signals. The gradient coil assembly 122 forms part of a magnet assembly 124 that includes a polarizing magnet 126 and a whole-body RF coil 128.

RF excitation waveforms are applied to the RF coil 128, or a separate local coil (not shown in FIG. 1), by the RF system 120 to perform the prescribed magnetic resonance pulse sequence. Responsive MR signals detected by the RF coil 128, or a separate local coil (not shown in FIG. 1), are received by the RF system 120, amplified, demodulated, filtered, and digitized under direction of commands produced by the pulse sequence server 110. The RF system 120 includes an RF transmitter for producing a wide variety of RF pulses used in MR pulse sequences. The RF transmitter is responsive to the scan prescription and direction from the pulse sequence server 110 to produce RF pulses of the desired frequency, phase, and pulse amplitude waveform. The generated RF pulses may be applied to the whole body RF coil 128 or to one or more local coils or coil arrays (not shown in FIG. 1).

The RF system 120 also includes one or more RF receiver channels. Each RF receiver channel includes an RF amplifier that amplifies the MR signal received by the coil 128 to which it is connected, and a detector that detects and digitizes the I and Q quadrature components of the received MR signal. The magnitude of the received MR signal may thus be determined at any sampled point by the square root of the sum of the squares of the I and Q components:

$$M=\sqrt{I^2+Q^2} \quad (1);$$

and the phase of the received MR signal may also be determined:

$$\phi = \tan^{-1}\left(\frac{Q}{I}\right). \quad (2)$$

The pulse sequence server 110 also optionally receives patient data from a physiological acquisition controller 130. The controller 130 receives signals from a number of different sensors connected to the patient, such as electrocardiograph ("ECG") signals from electrodes, or respiratory signals from a bellows or other respiratory monitoring device. Such signals are typically used by the pulse sequence server 110 to synchronize, or "gate," the performance of the scan with the subject's heart beat or respiration.

The pulse sequence server 110 also connects to a scan room interface circuit 132 that receives signals from various sensors associated with the condition of the patient and the magnet system. It is also through the scan room interface circuit 132 that a patient positioning system 134 receives commands to move the patient to desired positions during the scan.

The digitized MR signal samples produced by the RF system 120 are received by the data acquisition server 112. The data acquisition server 112 operates in response to instructions downloaded from the workstation 102 to receive the real-time MR data and provide buffer storage, such that no data is lost by data overrun. In some scans, the data acquisition server 112 does little more than pass the acquired MR data to the data processor server 114. However, in scans that require information derived from acquired MR data to control the further performance of the scan, the data acquisition server 112 is programmed to produce such information and convey it to the pulse sequence server 110. For example, during prescans, MR data is acquired and used to calibrate the pulse sequence performed by the pulse sequence server 110. Also, navigator signals may be acquired during a scan and used to adjust the operating parameters of the RF system 120 or the gradient system 118, or to control the view order in which k-space is sampled. The data acquisition server 112 may also be employed to process MR signals used to detect the arrival of contrast agent in a magnetic resonance angiography ("MRA") scan. In all these examples, the data acquisition server 112 acquires MR data and processes it in real-time to produce information that is used to control the scan.

The data processing server 114 receives MR data from the data acquisition server 112 and processes it in accordance with instructions downloaded from the workstation 102. Such processing may include, for example: Fourier transformation of raw k-space MR data to produce two or three-dimensional images; the application of filters to a reconstructed image; the performance of a backprojection image reconstruction of acquired MR data; the generation of functional MR images; and the calculation of motion or flow images.

Images reconstructed by the data processing server 114 are conveyed back to the workstation 102 where they are stored. Real-time images are stored in a data base memory cache (not shown in FIG. 1), from which they may be output to operator display 112 or a display 136 that is located near the magnet assembly 124 for use by attending physicians. Batch mode images or selected real time images are stored in a host database on disc storage 138. When such images have been reconstructed and transferred to storage, the data processing server 114 notifies the data store server 116 on the workstation 102. The workstation 102 may be used by an operator to archive the images, produce films, or send the images via a network to other facilities.

Figure 2:
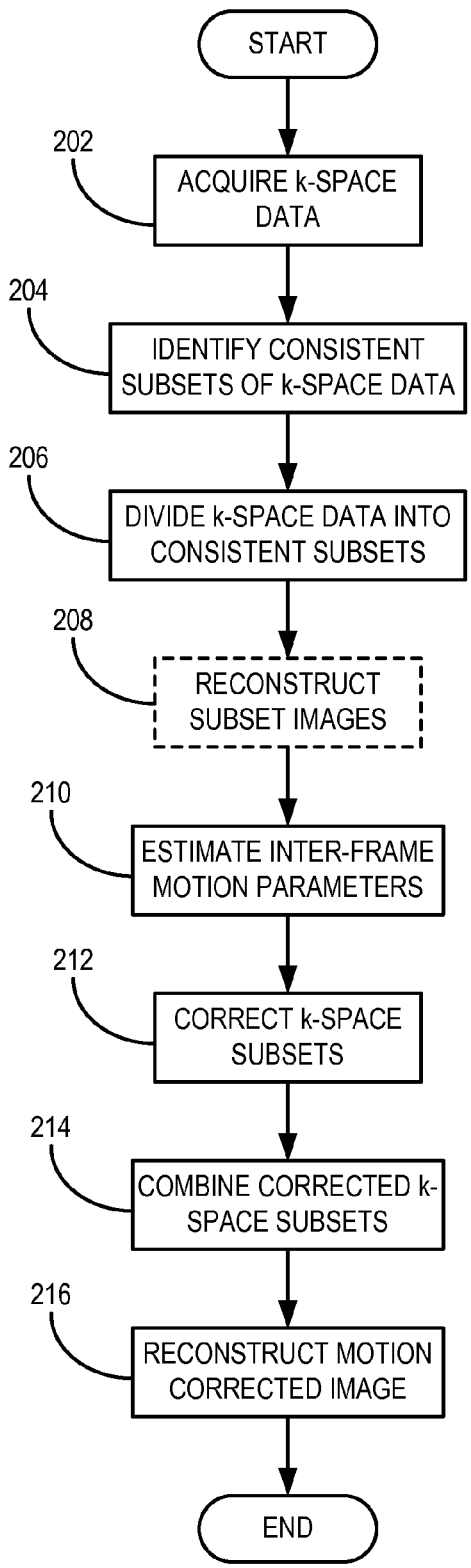
FIG. 2 is a flowchart setting forth the steps of an exemplary method for correcting motion-related errors in k-space data acquired with an MRI system by sampling k-space along non-Cartesian trajectories.

Referring to FIG. 2, a flowchart setting forth the steps of an exemplary method for correcting motion-related errors in k-space data acquired with an MRI system by sampling k-space along non-Cartesian trajectories is illustrated. The method begins with the acquisition of k-space data with the MRI system, as indicated at step 202. The k-space data is acquired as a time series that contains a plurality of individual time frames. By way of example, a time frame may contain only one radial projection or, alternatively, may contain a plurality of temporally adjacent radial projections. As noted, k-space data is acquired by sampling k-space along non- Cartesian trajectories. For example, k-space may be sampled along radial trajectories or spiral trajectories. The k-space data may be acquired in a sequential fashion by rotating a radial projection sequentially through a plurality of angles; however, it is contemplated that using a random or pseudo-random ordering of the radial trajectories will improve the efficacy of the motion compensation method. When a pseudorandom ordering is implemented, a series of interleaved sampling patterns may be selected and then ordered using, for example, a bit reverse ordering or a golden angle ordering technique.

The acquired k-space data is analyzed to identify consistent subsets of the acquired k-space data, as indicated at step 204. In general, this process includes identifying those time frames at which motion occurs and grouping the time frames therebetween into the consistent subsets. Consistent subsets of k-space data may be identified, for example, using a multichannel center-of-mass ("COM") technique to identify those time frames at which motion occurred; however, in the alternative, other data consistency techniques can be utilized to identify those time frames corrupted by motion. Alternatively, consistent data subsets can be formed based on COM values alone. For example, those small subsets of data, or time frames, that have similar COM values can be grouped together into consistent data subsets.

When a single receiver coil is used to acquire the k-space data, COM plots, and/or plots from other data consistency measures, are produced. When a multiple channel receiver coil array is used to acquire the k-space data, a plurality of such COM and/or other plots are produced. In using a multiple channel receiver coil array, each receiver coil in the array effectively images a different object. Thus, when the object moves, the coils remain fixed in position, thereby eliminating the linear dependence between the translational motion vector and COM values. This diminishes the capabilities for COM analysis to accurately estimate motion. However, because each receiver coil records a different amount of motion, multi-channel COM analysis becomes an even more robust method of motion detection that is sensitive not only to translational motion, but to rotational motion as well. Using COM motion estimation techniques, different small subsets of k-space data, such as time frames of k-space data, are matched to identify those larger subsets that are consistent with each other, and those at which motion occurred and that are, therefore, inconsistent. As will be described below in more detail, consistent subsets that are too small for accurate registration may be discarded or weighted to decrease their overall contribution to the target, motion-compensated, image.

As an example, to subdivide the k-space data into consistent data subsets, COM, or other data consistency, values for each small subset, or time frame, are calculated and stacked into vectors of length $N_c \cdot N_d$, where $N_c$ is the number of receiver coils and $N_d$ is the dimensionality of the data acquisition, such as two or three. These vectors are then analyzed to detect motion as, for example, instances of rapid signal changes in the plots of the COM, or other data consistency, values. These rapid signal changes may be determined using correlation techniques, in which motion is identified as occurring when a correlation value falls below a preselected threshold value, such as a threshold value determined by the noise level in the k-space data measurements. Alternatively, a step or edge detection technique can be utilized to identify rapid signal changes in the COM, or other data consistency, values. In the presence of continuous motion, slow drifts will appear in the plots of the COM, or other data consistency, values. In these instances, motion may be defined as occurring when a change in the COM, or other data consistency, value with respect to a previously identified instance of motion is above a preselected threshold value.

Figure 3A:
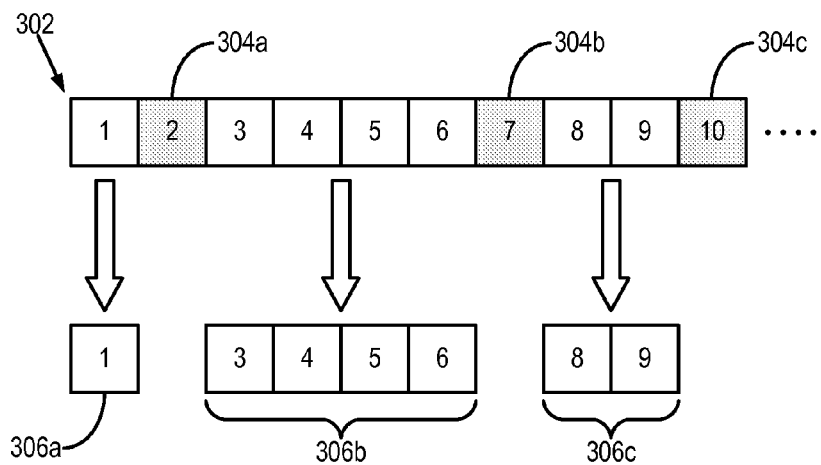
FIG. 3A is a graphic illustration of an exemplary time series of k-space time frame data sets, including the segmentation of those time frames that form consistent subsets of k-space data in accordance with embodiments of the invention.
Figure 3B:
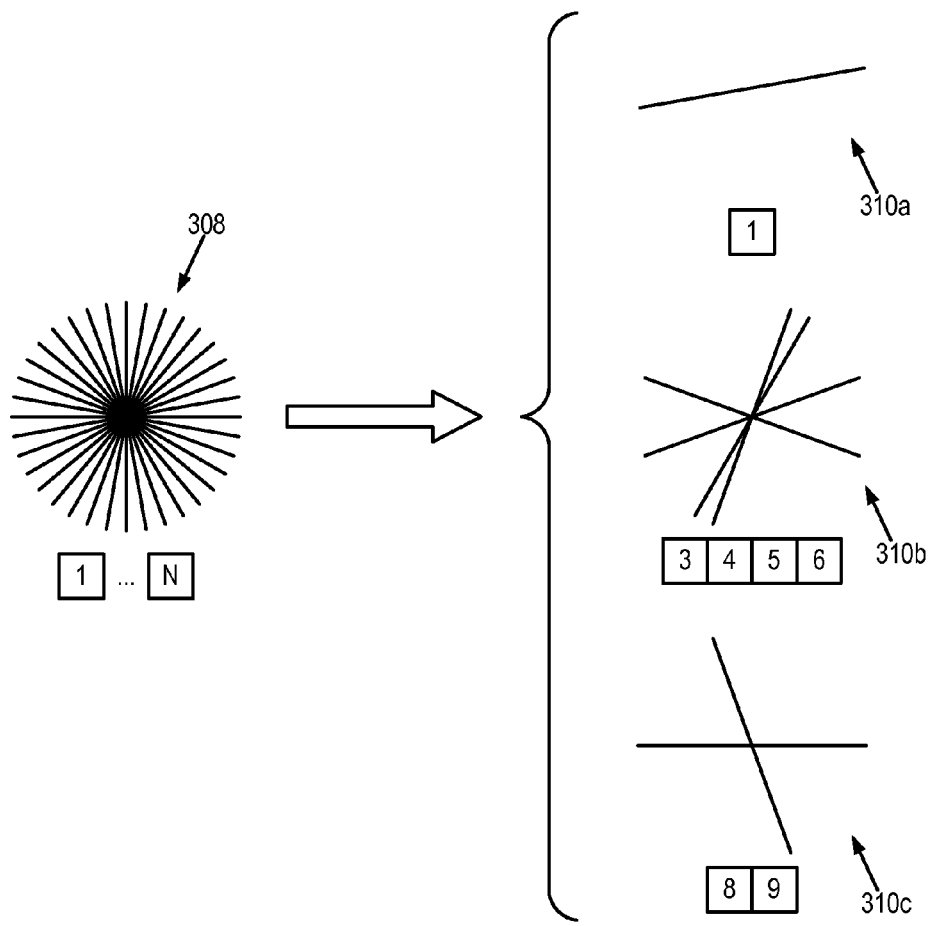
FIG. 3B is a graphic illustration of segmenting a k-space data set into a plurality of data subsets.

The acquired k-space data is next divided into a plurality of data subsets, as indicated at step 206, in accordance with the consistent subsets identified in step 204. By way of example, referring now to FIGS. 3A and 3B, an exemplary time series 302 of individual k-space time frames is illustrated. This time series 302 is analyzed to determine time frames at which motion occurred. In the example illustrated in FIG. 3A, time frame two 304a, time frame seven 304b, and time frame ten 304c are identified as being corrupted by motion. For example, these time frames are identified as being corrupted by motion using the multi-channel COM, or other multi-channel data consistency, technique described above. The time series 302 is divided into the consistent subsets of k-space data by selecting those temporally adjacent k-space time frames delineated by the motion corrupted, or inconsistent, time frames 304a, 304b, 304c. Thus, a first subset 306a contains time frame one; a second subset 306b contains time frames three, four, five, and six; and a third subset 306c contains time frames eight and nine. These k-space data subsets are illustrated in FIG. 3B, where the k-space data set 308 corresponding to the time series 302 is shown as being divided into a first consistent subset 310a containing k-space data acquired at the first subset 306a of time frames, a second consistent subset 310b containing k-space data acquired at the second subset 306b of time frames, and a third consistent subset 310c containing k-space data acquired at the third subset 306c of time frames. It is noted that the illustrated k-space data set 308 was acquired with a random view ordering; thus, while the radial projections in each of the consistent subsets 310a, 310b, 310c were sequentially acquired in time, the k-space locations that each radial sampled are not necessarily adjacent in k-space.

In the alternative, the consistent subsets may be determined prospectively without analyzing the acquired k-space data to identify those time frames at which motion occurred. For example, such an approach may be beneficial for imaging in regions of periodic physiological motion that can be accurately monitored, such as with cardiac gated and respiratory gated imaging. In these circumstances, it may be less difficult to anticipate when subject motion will occur by using the physiological gating signal.

Figure 4:
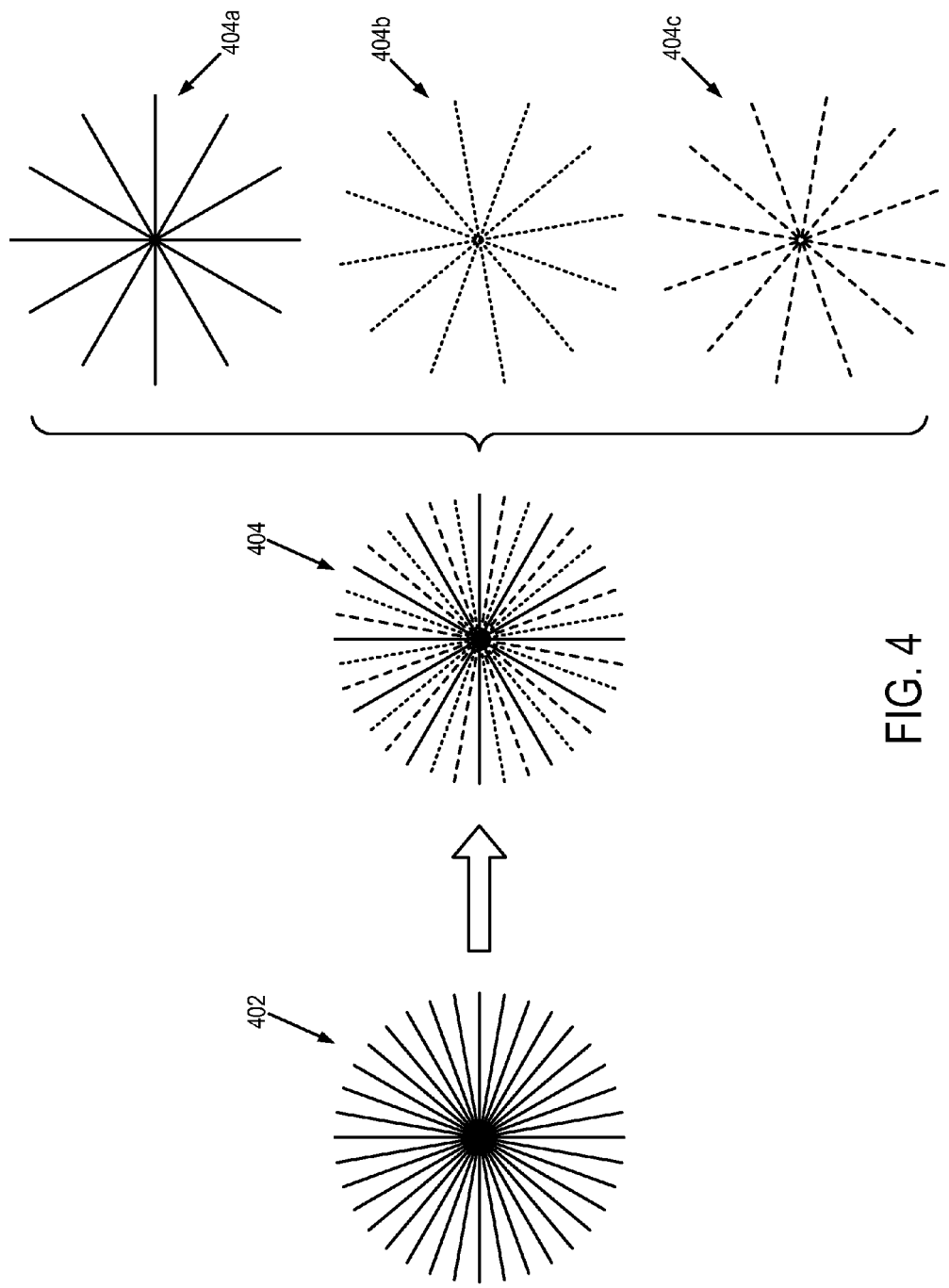
FIG. 4 is a graphic illustration of segmenting a k-space data set into a plurality of data subsets using a predetermined segmentation scheme.

Referring now to FIG. 4, an alternative method for segmenting the acquired k-space data into a plurality of consistent subsets is to prospectively prescribe the time frames belonging to each consistent subset of data. By way of example, the acquired k-space data 402 may be divided into interleaved subsets of k-space data. The acquired k-space data set 402, which may contain radial samplings of k-space as illustrated or other non-Cartesian trajectories as mentioned above, is segmented into a plurality of interleaved subsets 404. For example, every second radial or every third radial may be assigned to a different subset. Using the latter example, the k-space data set 402 is segmented into three interleaved k-space data subsets 404a, 404b, 404c.

Referring again now to FIG. 2, a plurality of subset images are reconstructed from the data subsets produced in step 206, as indicated at step 208. In some embodiments, only a sufficiently sampled portion of the data subsets are used for this reconstruction. For example, subsets of radial or spiral trajectories are considered to have sufficiently sampled portions when a central portion of k-space is sampled in accordance with the Nyquist criterion out to a particular radius. Because the portion of k-space sampled within this radius contains the lower spatial frequencies, images reconstructed from this central portion of k-space will exhibit low spatial resolution. For the purposes at hand, however, this low resolution is not a significant setback. From the reconstructed subset images, inter-frame motion parameters are estimated, as indicated at step 210. For example, to determine affine motion parameters the subset images may be co-registered to an image estimated from the largest consistent data subset or average of the subset images. When the acquired image data is subdivided using a predetermined segmentation scheme, affine motion parameters may also be determined by co-registering the subset images with an image estimated from some of the subsets, such as the first or last subset. Exemplary methods for co-registering images include correlation-based co-registration techniques and co-registration techniques that use mutual information minimization.

It will be appreciated that the inter-frame motion parameters may similarly be measured in k-space without reconstructing the subset images in step 208. Using the motion parameters estimated in step 210, the data subsets are corrected for motion, as indicated at step 212. The corrected subsets are then combined at step 214 to produce a corrected k-space data set, from which an image is reconstructed at step 216. Many different reconstruction algorithms may be employed, such as a regridding reconstruction technique and iterative reconstruction techniques. For example, if some of the k-space subsets contain less k-space data that a preselected threshold amount, they can be weighted during an iterative reconstruction technique such that their relative contribution to the reconstructed image is significantly reduced. For example, the k-space data set 310*a* in FIG. 3B, which only contains one radial projection, may be weighted in such an iterative reconstruction technique. Exemplary iterative reconstruction methods include, for example, the one described by R. Bammer, et al., in "Augmented Generalized SENSE Reconstruction to Correct for Rigid Body Motion," *Magnetic Resonance in Medicine*, 2007; 57(1):90-102.

It is worth noting that if no motion is detected in a particular data subset, for example at step 210, then no motion correction needs to be performed for that data subset. While this seems to be intuitive, many methods, such as those related to two-dimensional PROPELLER imaging, will attempt motion correction in any case. By forcing motion correction when no motion occurred, the resultant image quality is degraded. Thus, the aforementioned COM and/or data consistency check may be implemented in other imaging methods, such as PROPELLER, to improve the imaging quality of those methods. In the case of PROPELLER, the COM and/or data consistency check would allow for the combination of different blades into consistent subsets with subsequent co-registration for motion parameter estimation and motion correction when motion has occurred.

The present invention has been described in terms of one or more preferred embodiments, and it should be appreciated that many equivalents, alternatives, variations, and modifications, aside from those expressly stated, are possible and within the scope of the invention.

The invention claimed is:

1. A method for reconstructing a motion-compensated image depicting a subject with a magnetic resonance imaging (MRI) system, the steps of the method comprising:
    a) acquiring with the MRI system, a time series of k-space data sets by sampling k-space along non-Cartesian trajectories at a plurality of time frames;
    b) identifying in the time series of k-space data sets acquired in step a), ones of the plurality of time frames at which motion occurred;
    c) segmenting the time series of k-space data acquired in step a) to produce a plurality of k-space data subsets, each k-space data subsets containing k-space data acquired in temporally adjacent time frames occurring between the ones of the plurality of times frames at which motion occurred identified in step b);
    d) determining motion correction parameters from the k-space data subsets produced in step c);
    e) producing corrected k-space data subsets by applying the motion correction parameters determined in step d) to the k-space data subsets produced in step c);
    f) combining the corrected k-space data subsets produced in step e) to produce a corrected k-space data set; and
    g) reconstructing a motion-compensated image from the corrected k-space data set produced in step f).

2. The method as recited in claim 1 in which step f) includes identifying selected ones of the corrected k-space data subsets that contain less k-space data than a preselected threshold amount of k-space data; and in which step g) includes reconstructing a motion-compensated image from the corrected k-space data set produced in step f) using an iterative reconstruction technique in which k-space data associated with the identified selected ones of the corrected k-space data subsets are weighted by a weighting factor.

3. The method as recited in claim 2 in which the weighting factor decreases a relative contribution of the selected ones of the corrected k-space data subsets identified in step f).

4. The method as recited in claim 1 in which the non-Cartesian trajectories are at least one of radial trajectories, k-space blade trajectories, and spiral trajectories.

5. The method as recited in claim 1 in which step d) includes reconstructing subset images from the k-space data subsets produced in step c) and determining the motion correction parameters from the reconstructed subset images.

6. The method as recited in claim 5 in which step d) includes determining the motion correction parameters by:
    producing an average subset image by averaging the subset images; and
    co-registering each subset image to the produced average subset image.

7. The method as recited in claim 1 in which step d) includes determining the motion correction parameters by:
    identifying the k-space data subset produced in step c) that contains the largest amount of data in the plurality of k-space data subsets produced in step c);
    estimating an image from the identified k-space data subset; and
    co-registering each subset image to the estimated image.

8. The method as recited in claim 5 in which step d) includes reconstructing each subset image from a portion of the respective consistent data subset that includes k-space data sampled from a central portion of k-space within a Nyquist radius.

9. The method as recited in claim 1 in which step b) includes calculating a center-of-mass value for k-space data in each of the plurality of time frames and comparing center-of-mass values between ones of the plurality of time frames.

10. The method as recited in claim 9 in which step b) includes forming for each of the plurality of time frames, a data vector having a length equal to a number of receiver coils used to acquire the time series of k-space data in step a) times a dimensionality of the times series of k-space data acquired in step a), the data vector containing center-of-mass values for each of the plurality of time frames.

11. The method as recited in claim 10 in which step b) includes calculating correlation values between each data vector and identifying one of the plurality of time frames as a time frame at which motion occurred when the correlation value associated with the respective data vector is above a threshold value.

12. The method as recited in claim 11 in which the threshold value is determined by a noise level in the time series of k-space data acquired in step a).

13. The method as recited in claim 1 in which the motion correction parameters are determined in step d) by co-registering the k-space data subsets.

14. The method as recited in claim 1 in which the ones of the plurality of time frames at which motion occurred are identified in step c) by:
   i) calculating a data consistency measure for each time frame in the plurality of time frames; and
   ii) comparing the data consistency measures for ones of the plurality of time frames.

15. The method as recited in claim 14 in which the data consistency measure is a center-of-mass value.

16. The method as recited in claim 15 in which the plurality of k-space data subsets are produced in step c) by grouping those time frames in the plurality of time frames having similar center-of-mass values.

17. The method as recited in claim 1 in which step e) includes applying the motion correction parameters determined in step d) to respective ones of the k-space data subsets produced in step c) when the respective motion correction parameters exceed a threshold value.

18. The method as recited in claim 17 in which step b) includes generating information about whether motion is detected in each of the plurality of time frames in the time series of k-space data; and in which step e) includes applying the motion correction parameters determined in step d) to respective ones of the k-space data subsets produced in step c) using the information about whether motion is detected in each of the plurality of time frames in the time series of k-space data generated in step b).

19. A method for reconstructing a motion-compensated image depicting a subject with a magnetic resonance imaging (MRI) system, the steps of the method comprising:
   a) acquiring with the MRI system, a time series of k-space data sets by sampling k-space along non-Cartesian trajectories at a plurality of time frames;
   b) segmenting the time series of k-space data acquired in step a) to produce a plurality of k-space data subsets using a preselected segmentation scheme in which each k-space data subset contains k-space data acquired in temporally adjacent time frames;
   c) determining motion correction parameters from the k-space data subsets produced in step b);
   d) producing corrected k-space data subsets by applying the motion correction parameters determined in step c) to the k-space data subsets produced in step b);
   e) combining the corrected k-space data subsets produced in step d) to produce a corrected k-space data set; and
   f) reconstructing a motion-compensated image from the corrected k-space data set produced in step e).

20. The method as recited in claim 19 in which the non-Cartesian trajectories are at least one of radial trajectories, k-space blade trajectories, and spiral trajectories.

* * * * *